United States Patent [19]

Flanagan

[11] Patent Number: 5,162,762
[45] Date of Patent: Nov. 10, 1992

[54] PHASE-LOCK LOOP WITH ADAPTIVE SCALING ELEMENT

[75] Inventor: Richard T. Flanagan, Freehold, N.J.

[73] Assignee: AT&T Bell Laboratories, Murray Hill, N.J.

[21] Appl. No.: 673,992

[22] Filed: Mar. 25, 1991

[51] Int. Cl.$^5$ ............................................. H03L 7/093
[52] U.S. Cl. ........................................ 331/15; 331/17; 331/25
[58] Field of Search ...................... 331/17, 1 A, 25, 15

[56] References Cited

U.S. PATENT DOCUMENTS

| | | | |
|---|---|---|---|
| 2,923,893 | 2/1960 | Runyan | 331/15 X |
| 4,614,917 | 9/1986 | Zelitzki et al. | 331/17 X |
| 4,868,689 | 9/1989 | Egami et al. | 331/17 X |

Primary Examiner—Siegfried H. Grimm
Attorney, Agent, or Firm—R. D. Slusky

[57] ABSTRACT

A phase-lock loop includes a scaling element whose scale factor is adaptively adjusted as a function of the value of a state variable in the loop—illustratively, the magnitude thereof. That function is such that, after the adjustment has been made, the value taken on by the state variable is within a predetermined range. In particular embodiments, the scale factor and the state variable are simultaneously adjusted reciprocally, rather than simply adjusting only the scale factor and waiting for the normal operation of the loop to change the state variable, advantageously minimizing any transient degradation in loop performance that may occur as a result of the adjustment.

19 Claims, 3 Drawing Sheets

| TIME | A | SV |
|------|-----|---------------------|
| $t_1$ | 000 | 0000 0000 xxxx xxxx |
| $t_2$ | 001 | 0000 0000 xxxx xxxx |
| $t_3$ | 010 | 0000 0001 xxxx xxxx |
| $t_4$ | 011 | 0000 0010 xxxx xxxx |
| $t_5$ | 100 | 0000 0101 xxxx xxxx |
| $t_6$ | 101 | 0000 1011 xxxx xxxx |
| $t_7$ | 110 | 0001 0110 xxxx xxxx |
| $t_8$ | 110 | 0001 0110 xxxx xxxx |

PHASE-LOCK LOOP WITH ADAPTIVE SCALING ELEMENT

BACKGROUND OF THE INVENTION

The present invention relates to adaptive closed-loop control systems and, in particular, to phase-lock loops.

Phase-lock loops are used in modems and other communications devices in order to perform coherent demodulation. Specifically, one needs to be able to accurately track the frequency and phase of the carrier of an incoming signal in order to accurately recover the information contained in that signal.

One of the issues confronting the designer of phase-lock loops in such applications relates to the bandwidth of the loop. Ideally, one would like to minimize the bandwidth of the loop so as to be able to accurately track the signal in question while minimizing noise in the loop. On the other hand, the bandwidth must be sufficient to ensure that the full range of expected signals can be tracked. The resulting required design trade-off means that the performance of the loop may be sub-optimal.

Another issue relates to the fact that the loop may be confronted with signals whose parameters span a wide range, and the designer must take account of this when designing the circuit. For example, on the one hand, one would like to represent the signals being operated on with some minimum level of precision. On the other hand, achieving this level of precision across a wide range of signals can result in inordinately high circuit costs due to the need to use very large registers (for digital implementations) or very-high-precision amplifiers and other components (for analog implementations). As a result, trade-offs are often required which may, in turn, again result in sub-optimal performance.

One specific application in which these issues arise is in the tracking of frequency offset in the echoes which are returned to echo-canceling modems. The problem comes about because the echoes may experience frequency translation while traversing the telephone network. Thus, when they return to their source, there may be a discrepancy between the echo carrier frequency and the local carrier frequency. Unless such discrepancy is accounted for in the echo cancellation process, unacceptable performance may result. Accordingly, a phase-lock loop is typically used to generate an estimate of this frequency discrepancy—usually referred to as the "frequency offset" or "phase roll."

SUMMARY OF THE INVENTION

An adaptive closed-loop control system, such as a phase-lock loop, embodying the principles of the present invention overcomes the aforementioned problems in the prior art and is particularly useful in echo canceling modems. (Its use is not so limited, however.) In accordance with the invention, the system includes a scaling element whose scale factor is adaptively adjusted as a function of the value of a state variable in the loop—illustratively, the magnitude thereof. In specific embodiments of the invention, that function is such that, after the adjustment has been made, the value taken on by the state variable is within a predetermined range. The manner in which such a closed-loop system overcomes the aforementioned problems in the prior art is described hereinbelow.

In accordance with a feature of the invention, it is possible in, for example, digital implementations to simultaneously adjust the scale factor and the state variable reciprocally (so that the product of the state variable and the scale factor is the same immediately before and after the adjustment), rather than simply adjusting only the scale factor and waiting for the normal operation of the loop to propagate the change to the state variable. Advantageously, this approach minimizes any transient degradation in loop performance that may occur as a result of the adjustment.

Such degradation is also minimized, in accordance with a further feature of the invention, by making the scale factor adjustment over a sequence of steps, rather than using a single large adjustment. Such adjustment may be useful whether or not the above-mentioned reciprocal state variable adjustment is used.

DETAILED DESCRIPTION

Figure 1:
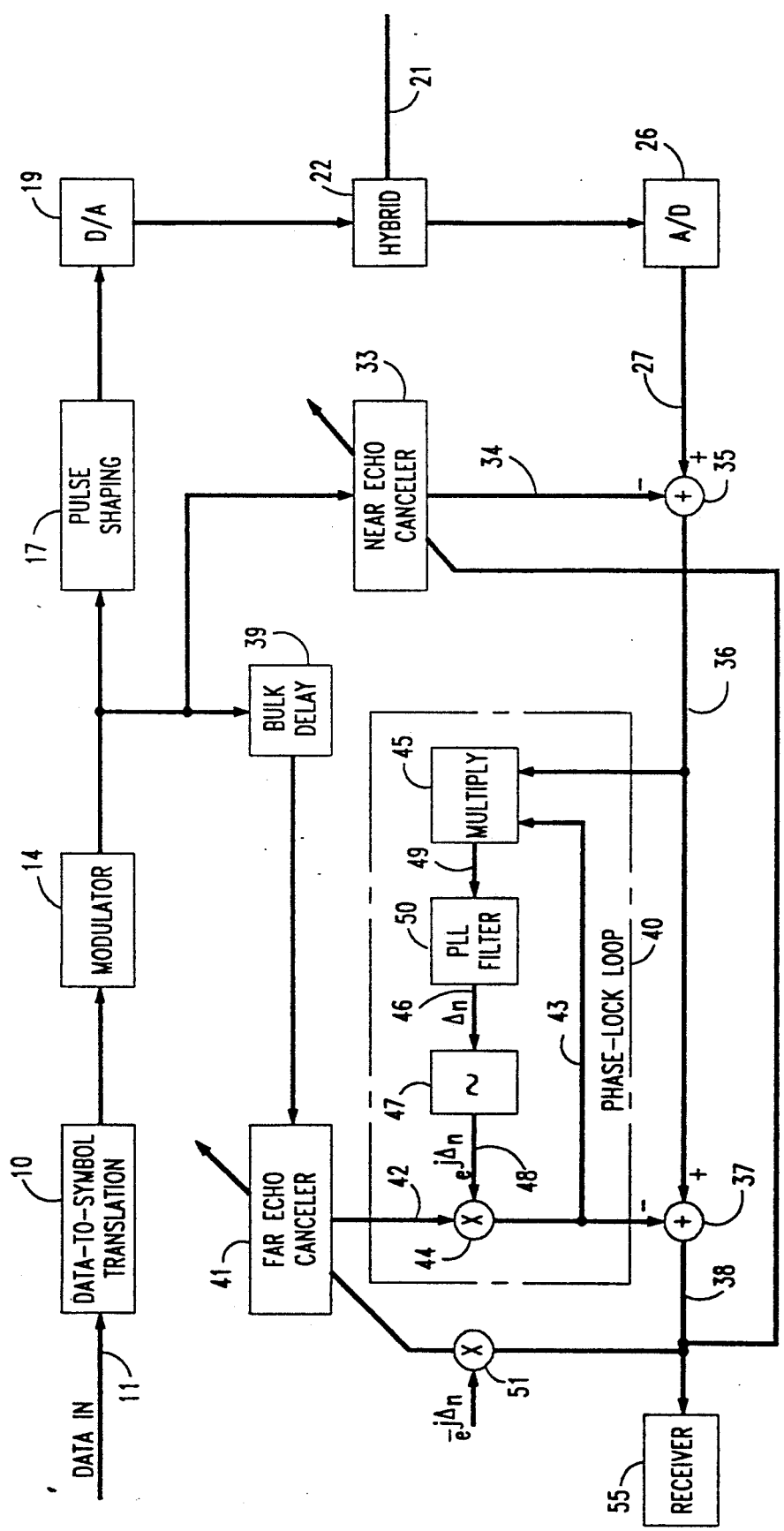
FIG. 1 is a block diagram of an echo canceling modem which includes a phase-lock loop embodying the principles of the invention.

The modem of FIG. 1 is of conventional design except for phase-lock loop filter 50 to be described.

Specifically, the modem receives input data on lead 11. That data is applied to data-to-symbol translation circuit 10, which performs the conventional steps of scrambling, encoding, and transmit symbol mapping. The symbols that are output by circuit 10 are modulated by modulator 14. The resulting modulated symbols are shaped by pulse shaping filter 17 and are coverted to analog form by D/A converter 19. The resulting analog line signal is applied to a two-wire communications channel 21—illustratively a dial-up voiceband telephone circuit—by way of hybrid 22.

In the other direction of communication, an analog line signal transmitted from a far modem (not shown) is received by hybrid 22 from channel 21 and is directed to A/D converter 26. This signal is referred to herein as the "far-end data signal." The signal reaching the input to A/D converter 26 is corrupted by so-called near and far echoes. The near echoes comprise transmit signal energy which, rather than having been directed to the channel by hybrid 22, has leaked through the hybrid. The far echoes are comprised of signal energy which was directed onto channel 21 by hybrid 22 in the first instance but which was reflected back to the modem as the result, for example, of impedance mismatches and other channel anomalies. The samples at the output of A/D converter 26 on lead 27 thus contain not only energy from the far-end data signal, but also near and far echo energy.

Accurate recovery of the data represented by the far-end data signal requires that the echo energy present in the samples on lead 27 be removed. To this end, near echo canceler 33 adaptively generates a replica of the near echo in response to the modulated symbols generated by modulator 14. That replica, provided on lead 34, is subtracted from the samples on lead 27 by subtractor 35, the output signal of which is provided on lead 36.

The modem further includes far echo canceler 41, which operates on a delayed version of the modulated symbols, provided by bulk delay element 39. Operating similarly to echo canceler 33, canceler 41 generates, on lead 42, an echo replica of the far echo. Unlike the near echo replica, however, the far echo replica must be frequency translated prior to being subtracted from the received signal. The reason for this is that, as noted earlier, echoes may experience frequency translation while traversing the telephone network. Thus, when they return to their source, there may be a discrepancy between the carrier frequency of the echoes and the local carrier frequency. Unless such discrepancy—referred to as the "frequency offset" or "phase roll"—is accounted for in the echo cancellation processing, unacceptable performance may result. (Since the near echo does not traverse the network, it is not subject to frequency offset and does not require a compensating translation within the modem).

Specifically, the frequency translation of the far echo replica is performed by a modulator 44, which receives a sinusoidal signal $e^{j\Delta_n}$, on lead 48, where $\Delta_n$ is a so-called angular estimate which is representative of the frequency offset and where n is an index which advances at the sample rate. That signal is provided by a phase-lock loop 40 of which modulator 44 is a part and which embodies the principles of the present invention. The output of modulator 44 is the frequency-offset-corrected far echo replica, which is subtracted from the signal on lead 36 by subtractor 37.

The phase-lock loop, in particular, includes phase-lock loop (PLL) filter 50, whose output on lead 46 represents the angular estimate $\Delta_n$. That parameter, in turn, is used by circuit 47 to generate the sinusoidal signal $e^{j\Delta_n}$ applied to modulator 44 as previously described. The feedback control signal for the loop begins with the output signal of modulator 44, on lead 43, which, in standard fashion, is multiplicatively combined by multiply circuit 45 with the signal on lead 36 to generate, on lead 49, an estimate of the angular error between the signals on leads 36 and 43. The phase of the signal on lead 43 represents an estimate of the phase of the far-end signal carrier. Indeed, it is the function of the loop as a whole—and PLL filter 50 specifically—to generate $\Delta_n$ in such a way as to achieve this.

Finally, the output of subtractor 37 on lead 38 is applied to receiver 55 which performs such standard steps as equalization, demodulation and decoding to recover the far-end data. Additionally, the signal on lead 38 is used as an adaptation error signal jointly for echo cancelers 33 and 41, the adaptation error signal for echo canceler 41 being first modulated by $e^{-j\Delta_n}$ by modulator 51.

Figure 2:
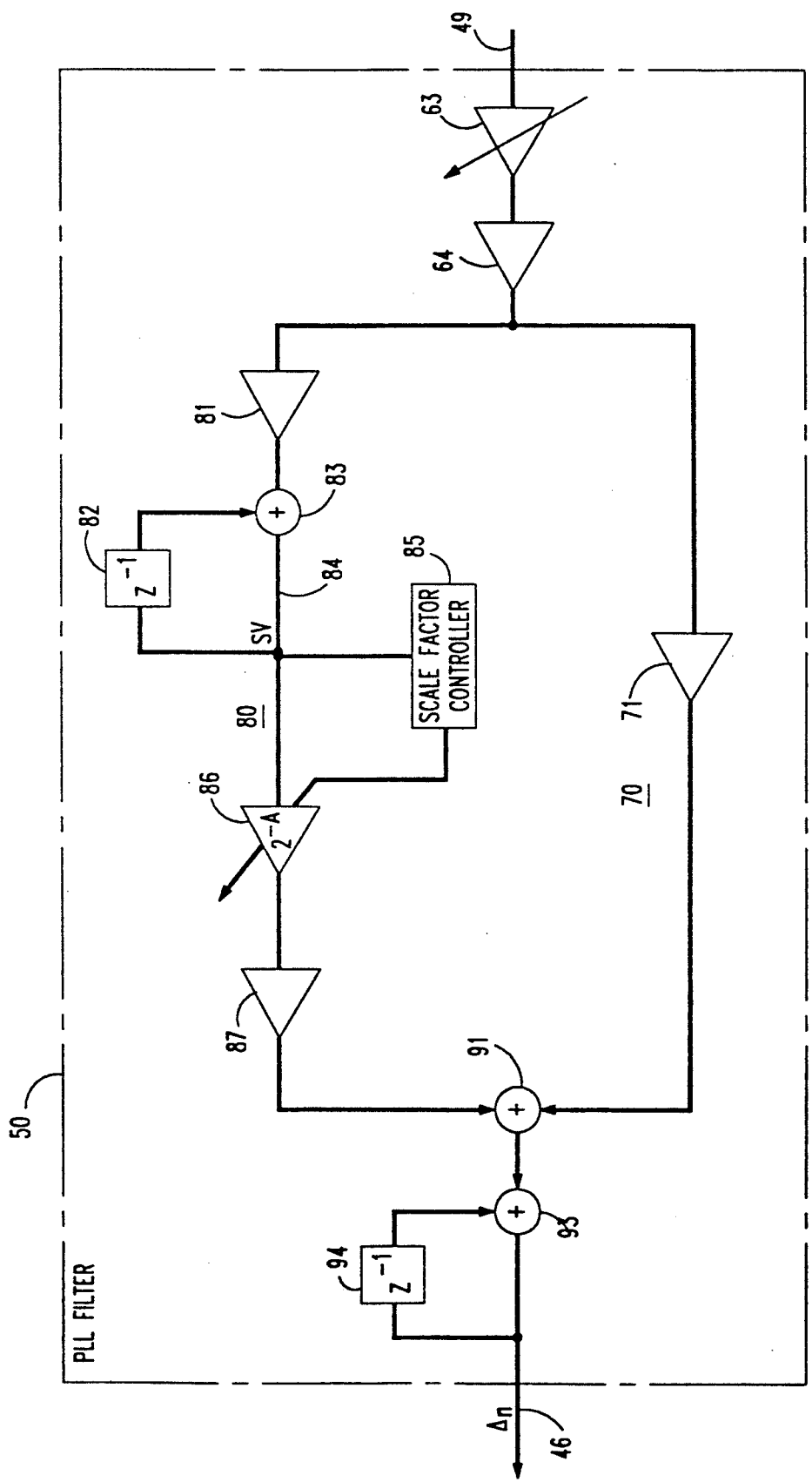
FIG. 2 is a block diagram of the phase-lock loop filter which is part of the phase-lock loop of FIG. 1.

Attention is now directed to FIG. 2, which shows phase-lock loop filter 50. Filter 50 is of generally conventional design except for the fact that the scale factor of scaling element 86 is adaptively determined in accordance with the invention, as described below.

Specifically, the angular error estimate from lead 49 is applied seriatim to scaling elements 63 and 64 for each updating cycle of the loop. (Prior to being applied to scaling element 63, that estimate may be applied to an averaging filter, not shown). The output of scaling element 64 is applied to parallel first-order and second-order computational paths 70 and 80, respectively. The outputs of the two paths are combined by adder 91 whose output is then processed by an integrator comprising delay element 94 and adder 93. The output of this integrator is the angular estimate, $\Delta_n$, provided on lead 46.

First-order path 70 simply includes a scaling element 71. Second-order path 80 includes a scaling element 81, followed by an integrator comprised of delay element 82—the delay of which, like that of delay element 94, is equal to the duration of a loop updating cycle—and adder 83. This is followed by scaling elements 86 and 87.

The scale factors of scaling elements 64, 71, 81 and 87 each take on a respective sequence of predetermined fixed values in accordance with a fixed schedule during training of the overall echo canceler circuitry, generally, and the phase-lock loop in particular. These values are chosen in such a way as to expedite initial acquisition of the angular estimate $\Delta_n$. The scale factor of scaling element 63 is adjustable and chosen as a function of the power of the signal on lead 42 so as to ensure that the operation of the loop is independent of the power of the far echo signal.

In accordance with the invention, the scale factor of scaling element 86 —which is illustratively an amount $2^{-A}$, where A is illustratively an integer—is adaptively adjusted as a function of the value of a state variable in the filter, illustratively the magnitude thereof. The parameter "A" is referred to herein as the "scaling exponent." Specifically, that function is such that, after the adjustment has been made, the value taken on by the state variable is within a predetermined range. In this embodiment, in particular, that state variable, SV, appears at the output of adder 83 on lead 84. The value of state variable SV is monitored by scale factor controller 85 which, in turn, adjusts the value of scaling exponent A and thus the scale factor $2^{-A}$, in accordance with the invention.

Note, in particular, that, if the scale factor of scaling element 86 is increased, the feedback mechanism that drives the loop will cause state variable SV to become proportionately smaller so that, all other things being equal, the output of scaling element 86 will be the same as it was before the adjustment. Conversely, if the scale factor of scaling element 86 is decreased, the feedback mechanism that drives the loop will cause state variable SV to become proportionately larger and again, all other things being equal, the output of scaling element 86 will be the same as it was before the adjustment.

However, the loop bandwidth will have been increased in the first case and decreased in the second case. That this is advantageous and, indeed, substantially ameliorates the problem described hereinabove relating to the prior art's need to make a trade-off in the loop bandwidth can be understood as follows:

The value of state variable SV is proportional to the frequency offset, and a large frequency offset requires a relatively large bandwidth in order for the loop to be able to track the resulting relatively rapid changes in the phase relationship between the echo carrier frequency and the local carrier frequency. Now consider the case where the value of state variable SV prior to the scale factor adjustment is relatively large (small). As a result, adjusting the scale factor in a way which causes state variable SV to be brought down (up) into the predetermined range after the adjustment, in accordance with the invention, means that the scale factor will adjusted to be proportionately larger (smaller) than its current value. As desired, then, the presence of a large (small) frequency offset will result in a proportionately large (small) loop bandwidth. Indeed, by appropriate selection of the aforementioned range, one can cause the loop to have an at least close-to-optimum bandwidth, i.e., a bandwidth which is sufficiently great to assure good tracking while minimizing noise in the tracking loop.

The invention provides another advantage. In particular, it is desirable that the signal at the output of scaling element 86 be maintained with a minimum of fluctuations over time. This, in turn, means that it is desirable that state variable SV be determined with high precision, independent of its actual magnitude. That is, it is advantageous to determine the value to some number of digit places no matter whether the value is large or small. The above-described approach, in fact, advantageously allows that to happen, without requiring very large registers (for digital implementations) or very-high-precision amplifiers and other components (for analog implementations). This comes about because state variable SV can be brought into whatever range is desired in order to be able to make use of the precision—e.g., number of register locations—that is, in fact, available.

Figures 3, 4:
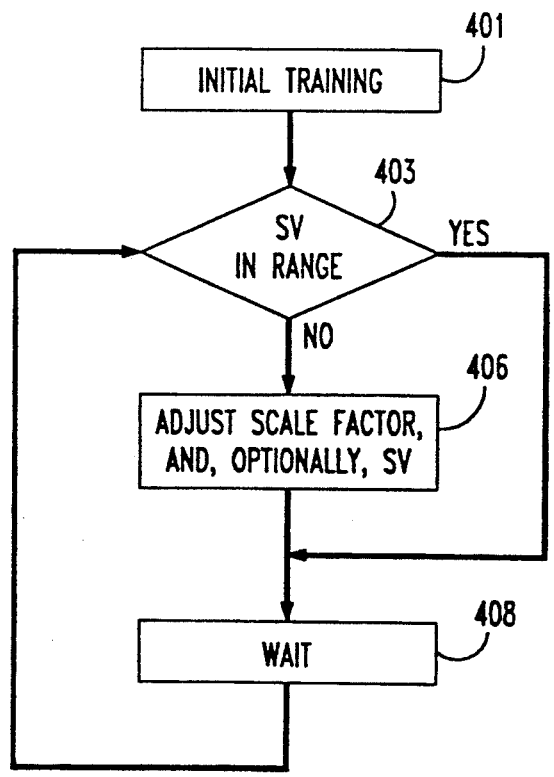
FIG. 3 is a table showing successive values taken on by a state variable within the filter of FIG. 2 as the scale factor of a scaling element within the filter is adjusted in accordance with the invention.
FIG. 4 is a flowchart showing how a scaling exponent—which is related to the scale factor—is adjusted over time in accordance with the invention.

The foregoing is illustrated by a specific example, shown in FIG. 3, in which the various signals are in binary form. It will usually be desirable for the scale factor adjustment to be made in a number of steps, rather than all at once, in order to minimize any transient degradation in loop performance that may occur as a result of the adjustment. Thus the table in FIG. 3 shows illustrative values of scaling exponent A, as specified by scale factor controller 85, and the corresponding values of state variable SV at successive points in time, $t_1$ through $t_8$, as the scaling exponent is changed. Time points $t_1$ through $t_8$ are separated by predetermined waiting time intervals during which a number of loop updating cycles occur, thereby allowing the loop operation to stabilize before proceeding with the next scaling exponent change.

Illustratively, state variable SV is represented by a 16-bit word and it is assumed that state variable SV is desired to be within the predetermined range 0010 0000 0000 0000 and 0001 0000 0000 0000. (The various 16-bit words herein are shown as broken up into groups of 4 bits simply to make them easier to read.) At time $t_1$, the value of state variable SV is 0000 0000 xxxx xxxx, where the x's are bits whose values are changing rapidly—with each loop updating cycle—as the result, for example, of noise in the loop. The value of scaling exponent A is 000 so that the scaling factor, $2^{-A}$, has the value $2^0 = 1$. Since the value of state variable SV is less than the lower limit of the predetermined range, scale factor controller 85 causes scaling exponent A to be increased—illustratively by unity—to binary 001 at time $t_2$, thereby changing the scaling factor to be $2^{-1} = \frac{1}{2}$. The value of state variable SV that results from the increase in the scale factor is still not within the desired range. Accordingly, scaling exponent A is further increased at successive time periods until, at time $t_7$, it is observed that the value of state variable SV has reached 0001 0110 xxxx xxxx and is, therefore, within the desired range. It will be observed that scaling exponent A has now been adjusted from binary 000 to binary 110. That value is thereafter held fixed, as indicated at the entry for time $t_8$, unless and until state variable SV goes outside of the range.

Note that the multiplication of the value of state variable SV by the scaling factor $2^{-A}$ results in the disappearance of the A lowest-order x's at the output of scaling element 86. Advantageously, then, as desired, the signal at the output of scaling element 86 is maintained with a minimum of fluctuations over time.

It was tacitly assumed hereinabove that, upon each change of scale factor $2^{-A}$, the loop arrives at the corresponding new value of state variable SV by simply allowing the normal operation of the loop to bring this about. However, in accordance with a feature of the invention, it is possible in, for example, digital implementations, to adjust not only the scale factor, but also to directly adjust the value of the state variable reciprocally therewith so that the product of the state variable and the scale factor is the same immediately before and after the adjustment. This puts the state variable immediately at the new value that it would otherwise have adjusted to over time, thereby a) accelerating the time needed to fully adjust the scale factor and b) minimizing any transient degradation in loop operation. In theory, one could adjust the scale factor and state variable in one large step. This would generally not be desirable, however, because the resulting, possibly gross, sudden change in bandwidth may adversely affect the loop performance. Additionally, in situations where the value of the state variable is small, such as at time $t_1$, it is not possible to accurately determine what the size of that one large step should be.

Before leaving FIG. 3, it may be noted that the overall effect of adjusting the scale factor in accordance with the invention is to transfer to scaling element 86 a coarse representation of the value that state variable SV would otherwise assume, thereby allowing the full resolution of the circuitry which holds state variabel SV—adder 83—to be used to maximum effect in terms of allowing for high precision computation to be maintained in the loop.

The flowchart of FIG. 4 shows how scaling exponent A is adjusted over time in accordance with the invention by circuitry which includes scale factor controller 85. In particular, the aforementioned initial training of the loop is represented by step 401. Thereafter, it is determined at step 403 whether state variable SV is within the predetermined range. If it is, the procedure waits for the aforementioned predetermined waiting time interval, i.e., the period of time between the successive time points of FIG. 3, at step 408 and then returns to step 403 to re-check the value of state variable SV. However, if during the initial execution of step 403, or at any time thereafter, it is determined that state variable SV is not within the predetermined range, then step 406 is executed, at which step the value of scaling exponent A is adjusted. The process then again waits at step 408 and returns to step 403.

As indicated in FIG. 4, step 406 optionally includes the direct adjustment of state variable SV, pursuant to the feature of the invention described hereinabove. The inclusion or non-inclusion of this feature in a particular embodiment will be one of the factors that determine, for example, the duration of the waiting time interval of step 408. Specifically, if state variable SV is not directly adjusted—that is, only the scale factor is adjusted and the state variable is allowed to assume a new value as the result of the subsequent, natural operation of the loop—then the scale factor adjustment will be relatively small and the waiting time interval will be relatively large as compared to what those parameters could be if the value of the state variable were to be directly adjusted along with the scale factor.

Although the flowchart of FIG. 4 shows the adjustment process as continuing indefinitely, practical considerations—such as register size—will usually require that the loop be traversed only some predetermined number of times during the training phase.

The foregoing merely illustrates the principles of the invention. Thus, for example, although the invention is disclosed as being implemented in a phase-lock loop, it is applicable to adaptive closed-loop control systems generally, as noted above.

Moreover, although the adjustable scaling element is shown as being located in the same loop branch as the state variable whose value is used to adjust the scale factor in accordance with the invention, it might be possible for other embodiments to have them in different branches. Moreover, in embodiments where the scaling element and state variable are, in fact, in the same branch, it is not necessary that, as in the present embodiment, the scaling element appears in that branch at a point after the state variable appears. Rather, the scaling element could appear ahead of the state variable. Such an approach would not yield the above-discussed advantage of the invention relating to the precision of the state variable—which issue could be dealt with in other ways using, for example, large registers, floating point arithmetic or analog technology. It would, however, continue to provide the other advantage relating to optimization of the loop bandwidth.

Although the predetermined range discussed herein is disclosed as having both an upper and lower bound, that range may be open-ended, i.e., have only one such bound, in some embodiments. This is equivalent to making the adjustment as a function of whether or not the state variable is greater (or, alternatively, less) than some desired value. In such embodiments, the amount of the adjustment may be such as to bring the value of the state variable to that desired value.

As far as implementation of the invention is concerned, those skilled in the art will recognize that embodiments such as that described herein typically operate on complex signals, only the real or imaginary parts of which may be used to carry out certain of the operations. In addition, various standard elements used in such embodiments have been omitted in the interest of clarity and simplicity, as will also be appreciated by those skilled in the art. Moreover, although the invention is disclosed herein for pedagogic clarity as being implemented using discrete functional circuit elements, those skilled in the art will appreciate that the functions of any one or more of those elements could be realized using one or more programmable processors, digital signal processing (DSP) chips, or other similar technologies.

It will thus be appreciated that those skilled in the art will be able to devise numerous arrangements which, although not explicity shown or described herein, embody the principles of the invention and are within its spirit and scope.

I claim:

1. An adaptive closed-loop control system comprising
    at least one scaling element,
    means for generating at least one state variable whose value is affected by the scale factor of said scaling element, and
    means for adaptively adjusting said scale factor exclusively as a function of the value of said state variable, wherein said adjusting means adjusts said scale factor when said state variable is outside of a predetermined range of values, the amount of said adjustment being such as to bring the value of said state variable to within said range, and wherein said adjustment is made over a sequence of steps.

2. The invention of claim 1 wherein said scale factor is adjusted as a function of the magnitude of said state variable.

3. The invention of claim 1 wherein said adjusting means adjusts said scale factor when said state variable is outside of a predetermined range of values, the amount of said adjustment being such as to bring the value of said state variable to within said range.

4. The invention of claim 2 wherein said adjusting means includes means for adjusting the value of said state variable concurrently with the adjusting of said scale factor, the adjustment to the value of said state variable being reciprocal to the adjustment of said scale factor.

5. The invention of claim 4 wherein said adjustment is made over a sequence of steps.

6. The invention of claim 1 wherein said adjusting means adjusts said scale factor when said state variable differs from a desired value, the amount of said adjustment being such as to bring the value of said state variable to substantially said desired value.

7. Apparatus for generating an estimate of a frequency offset, said frequency offset being the difference between the frequency of a local carrier signal and the frequency of the carrier of a received signal, said apparatus comprising
    means for maintaining a state variable representative of said estimate in response to a succession of error signals,
    means for scaling said state variable by a scale factor, and
    means for generating said frequency offset estimate as a function of the resulting scaled state variable,
    said estimate generating means including means for adaptively adjusting said scale factor exclusively as a function of the value of said state variable, wherein said adjusting means adjusts said scale factor when said state variable is outside of a predetermined range of values, the amount of said adjustment being such as to bring the value of said state variable to within said range, and wherein said scale factor is adjusted over a sequence of steps, and
    means for generating said succession of error signals as a function of the difference between the phase of said received signal carrier and an estimate of that phase.

8. A method for use in an adaptive close-loop control system, said loop system including at least one scaling element and means for generating at least one state variable whose present value is affected by the scale factor of said scaling element, said method comprising the step of adjusting said scale factor exclusively in response to the present value of said state variable, wherein said scale factor is adjusted over a sequence of steps.

9. The invention of claim 8 wherein said scale factor is adjusted as a function of the magnitude of said state variable.

10. The invention of claim 8 wherein in said adjusting step said scale factor is adjusted when said state variable is outside of a predetermined range of values, the amount of said adjustment being such as to bring the value of said state variable to within said range.

11. The invention of claim 9 comprising the further step of adjusting the value of said variable concurrently with the adjusting of said scale factor, the adjustment to the value of said state variable being reciprocal to the adjustment of said scale factor.

12. The invention of claim 8 wherein in said adjusting step said scale factor is adjusted when said state variable differs from a desired value, the amount of said adjustment being such as to bring the value of said state variable to substantially said desired value.

13. A phase tracking method for generating an estimate of a frequency offset, said frequency offset being the difference between the frequency of a local carrier signal and the frequency of the carrier of a received signal, said method comprising the steps of
maintaining a state variable representative of said estimate in response to a succession of error signals,
scaling said state variable by a scale factor,
generating said frequency offset estimate as a function of the resulting scaled state variable, said estimate generating step including the step of adaptively adjusting said scale factor exclusively as a function of the value of said state variable, and
generating said succession of error signals as a function of the difference between the phase of said received signal carrier and an estimate of that phase, wherein in said adjusting step said scale factor is adjusted when said state variable differs from a desired value, the amount of said adjustment being such as to bring the value of said variable to substantially said desired value.

14. A phase tracking method for generating an estimate of a frequency offset, said frequency offset being the difference between the frequency of a local carrier signal and the frequency of the carrier of a received signal, said method comprising the steps of
maintaining a state variable representative of said estimate in response to a succession of error signals,
scaling said state variable by a scale factor,
generating said frequency offset estimate as a function of the resulting scaled state variable, said estimate generating step including the step of adaptively adjusting said scale factor exclusively as a function of the value of said state variable, wherein in said adjusting step said scale factor is adjusted when said state variable is outside of a predetermined range of values, the amount of said adjustment being such as to bring the value of said state variable to within said range,
generating said succession of error signals as a function of the difference between the phase of said received signal carrier and an estimate of that phase, and
adjusting the value of said state variable concurrently with the adjusting of said scale factor, the adjustment to the value of said state variable being reciprocal to the adjustment of said scale factor.

15. Apparatus for generating an estimate of a frequency offset, said frequency offset being the difference between the frequency of a local carrier signal and the frequency of the carrier of a received signal, said apparatus comprising.
means for maintaining a state variable representative of said estimate in response to a succession of error signals,
means for scaling said state variable by a scale factor, and
means for generating said frequency offset estimate as a function of the resulting scaled state variable,
said estimate generating means including means for adaptively adjusting said scale factor exclusively as a function of the value of said state variable, and
wherein said scale factor is adjusted over a sequence of steps.

16. The invention of claim 15 further comprising means for generating said succession of error signals as a function of the difference between the phase of said received signal carrier and an estimate of that phase.

17. The invention of claim 16 wherein said adjusting means adjusts said scale factor when said state variable is outside of a predetermined range of values, the amount of said adjustment being such as to bring the value of said state variable to within said range.

18. Apparatus for generating an estimate of a frequency offset, said frequency offset being the difference between the frequency of a local carrier signal and the frequency of the carrier of a received signal, said apparatus comprising
means for maintaining a state variable representative of said estimate in response to a succession of error signals,
means for scaling said state variable by a scale factor,
means for generating said frequency offset estimate as a function of the resulting scaled state variable,
said estimate generating means including means for adaptively adjusting said scale factor exclusively as a function of the value of said state variable, and
means for generating said succession of error signals as a function of the difference between the phase of said received signal carrier and an estimate of that phase,
wherein said adjusting means adjusts said scale factor when said state variable differs from a desired value, the amount of said adjustment being such as to bring the value of said state variable to substantially said desired value.

19. Apparatus for generating an estimate of a frequency offset, said frequency offset being the difference between the frequency of a local carrier signal and the frequency of the carrier of a received signal, said apparatus comprising
means for maintaining a state variable representative of said estimate in response to a succession of error signals,
means for scaling said state variable by a scale factor,
means for generating said frequency offset estimate as a function of the resulting scaled state variable,
said estimate generating means including means for adaptively adjusting said scale factor exclusively as a function of the value of said state variable,
means for generating said succession of error signals as a function of the difference between the phase of said received signal carrier and an estimate of that phase, and
means for adjusting the value of said state variable concurrently with the adjusting of said scale factor, the adjustment to the value of said state variable being reciprocal to the adjustment of said scale factor,
wherein said adjusting means adjusts said scale factor when said state variable is outside of a predetermined range of values, the amount of said adjustment being such as to bring the value of said state variable to within said range.

* * * * *